United States Patent
Gardner et al.

(10) Patent No.: US 11,887,897 B2
(45) Date of Patent: *Jan. 30, 2024

(54) HIGH PRECISION 3D METAL STACKING FOR A PLURALITY OF 3D DEVICES

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 295 days.

This patent is subject to a terminal disclaimer.

(21) Appl. No.: 17/237,628

(22) Filed: Apr. 22, 2021

(65) Prior Publication Data

US 2022/0139786 A1 May 5, 2022

Related U.S. Application Data

(60) Provisional application No. 63/107,770, filed on Oct. 30, 2020.

(51) Int. Cl.
*H01L 21/8238* (2006.01)
*H01L 27/092* (2006.01)
(Continued)

(52) U.S. Cl.
CPC ............ *H01L 21/823885* (2013.01); *H01L 21/823871* (2013.01); *H01L 27/0922* (2013.01);
(Continued)

(58) Field of Classification Search
CPC ........... H01L 29/7827; H01L 29/7828; H01L 29/78642; H01L 29/41741; H01L 21/823885; H01L 21/8221; H01L 21/823871; H01L 29/66666; H01L 29/66545; H01L 29/0657; H01L 27/0922; H01L 27/088; H01L 27/092
See application file for complete search history.

(56) References Cited

U.S. PATENT DOCUMENTS

| | | | |
|---|---|---|---|
| 5,308,778 A * | 5/1994 | Fitch | H01L 27/0688 257/E29.267 |
| 7,936,000 B2 * | 5/2011 | Tang | H01L 29/66666 257/302 |

(Continued)

*Primary Examiner* — Michael M Trinh
(74) *Attorney, Agent, or Firm* — Oblon, McClelland, Maier & Neustadt, L.L.P.

(57) ABSTRACT

Aspects of the present disclosure provide a method of fabricating a semiconductor device. For example, the method can include providing a substrate. The substrate can include a first type region and a second type region. The method can also include forming a multilayer stack on the substrate. The multilayer stack can include alternate metal layers and dielectric layers. The method can also include forming first and second openings through the multilayer stack to uncover the first and second type regions, respectively. The method can also include forming first and second vertical channel structures within the first and second openings, respectively. Each of the first and second vertical channel structures can have source, gate and drain regions being in contact with vertical sidewalls of the metal layers of the multilayer stack uncovered by a respective one of the first and second openings.

7 Claims, 14 Drawing Sheets

(51) Int. Cl.
    *H01L 29/66*     (2006.01)
    *H01L 29/78*     (2006.01)
    *H01L 29/786*     (2006.01)
    *H01L 29/417*     (2006.01)
    *H01L 21/822*     (2006.01)
    *H01L 29/06*     (2006.01)

(52) U.S. Cl.
    CPC .. *H01L 29/41741* (2013.01); *H01L 29/66545* (2013.01); *H01L 29/66666* (2013.01); *H01L 29/7827* (2013.01); *H01L 29/7828* (2013.01); *H01L 29/78642* (2013.01); *H01L 21/8221* (2013.01); *H01L 29/0657* (2013.01)

(56) References Cited

U.S. PATENT DOCUMENTS

| | | | |
|---|---|---|---|
| 11,302,587 B2* | 4/2022 | Gardner | H01L 21/823828 |
| 11,557,657 B2* | 1/2023 | Fulford | H01L 21/823487 |
| 2011/0012085 A1* | 1/2011 | Deligianni | H01L 29/78642 257/E21.409 |
| 2018/0138189 A1* | 5/2018 | Kai | H10B 43/35 |
| 2020/0118996 A1* | 4/2020 | Parikh | H01L 27/0688 |
| 2022/0005805 A1* | 1/2022 | Fulford | H01L 21/823885 |

\* cited by examiner

HIGH PRECISION 3D METAL STACKING FOR A PLURALITY OF 3D DEVICES

INCORPORATION BY REFERENCE

This present disclosure claims the benefit of U.S. Provisional Application No. 63/107,770, "High Precision 3D Metal Stacking for a Plurality of 3D devices" filed on Oct. 30, 2020, which is incorporated herein by reference in its entirety.

FIELD OF THE INVENTION

The present disclosure relates to semiconductor fabrication, and, more particularly, to methods of fabricating high precision 3D metal stacking for a plurality of 3D devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the microscale or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration is seen as a viable option to continue semiconductor scaling. As the contacted gate pitch reaches its scaling limit due to manufacturing variability and electrostatic device limitations, 2D transistor density scaling stops.

SUMMARY 3D integration, i.e., the vertical stacking of multiple devices, aims to overcome these scaling limitations by increasing transistor density in volume rather than area. Complementary metal oxide semiconductor (CMOS) very-large-scale integration (VLSI) scaling, as used for example in CPU or GPU products, is exploring adoption of 3D integration as a primary means of moving the semiconductor roadmap forward, and thus desires enabling technologies. One such technology can take advantage of thermal bonding of separate nanoplane dielectric layer stacks on separate substrates to form a combined dielectric layer stack and increase resulting transistor density.

Aspects of the present disclosure provide a method of fabricating a semiconductor device. For example, the method can include forming a multilayer stack on a substrate. The multilayer stack can include alternate metal layers and dielectric layers. The method can also include forming a first opening and a second opening through the multilayer stack to uncover a semiconductor layer of the substrate, forming a first vertical channel structure within the first opening, and forming a second vertical channel structure within the second opening. For example, the first vertical channel structure can have a first source region, a first gate region and a first drain region being in contact with vertical sidewalls of the metal layers of the multilayer stack uncovered by the first opening, respectively. As another example, the second vertical channel structure can have a second source region, a second gate region and a second drain region being in contact with vertical sidewalls of the metal layers of the multilayer stack uncovered by the second opening, respectively.

In an embodiment, forming a first vertical channel structure can include: forming a first type channel material on the semiconductor layer of the substrate within the first opening until covering a vertical sidewall of a first one of the metal layers of the multilayer stack to form the first source region of the first vertical channel structure; forming a first gate material on the first source region until covering a vertical sidewall of a second one of the metal layers of the multilayer stack above the first metal layer to form the first gate material of the first vertical channel structure; and forming the first type channel material on the first source region and the first gate region until covering a vertical sidewall of a third one of the metal layers of the multilayer stack above the second metal layer to form the first drain region of the first vertical channel structure. For example, the first source region can also cover a vertical sidewall of at least one of the dielectric layers of the multilayer stack between the first metal and the semiconductor layer of the substrate. As another example, the first source region can also cover a portion of a vertical sidewall of at least one of the dielectric layers of the multilayer stack between the first metal layer and the second metal layer.

In another embodiment, the first gate region and the first drain region can be formed by forming the first gate material on the first source region until covering the vertical sidewalls of the second and third metal layers and at least one of the dielectric layers of the multilayer stack therebetween, forming the first type channel material on the first source region before reaching the third metal layer, removing a portion of the first gate material higher than the first type channel material such that the first gate region covers the vertical sidewall of the second metal layer, and forming the first drain region with the first type channel material such that the first drain region covers the vertical sidewall of the third metal layer.

For example, the substrate can include a first type region and a second type region, the first opening can be formed through the multilayer stack to uncover the semiconductor layer of the substrate within the second type region, and the second opening can be formed through the multilayer stack to uncover the semiconductor layer of the substrate within the first type region. As another example, the substrate can further include a diffusion break formed between the first type region and the second region.

Aspects of the present disclosure also provide a method of fabricating a semiconductor device. For example, the method can include forming a multilayer stack on a substrate. The multilayer stack can include alternate metal layers and dielectric layers. The method can also include forming a first opening and a second opening through the multilayer stack to uncover a semiconductor layer of the substrate, forming a first vertical channel structure within the first opening, and forming a second vertical channel structure within the second opening. For example, the first vertical channel structure can have a first source region being in contact with a vertical sidewall of a first one of the metal layers uncovered by the first opening, a first drain region being in contact with a vertical sidewall of a second one of the metal layers uncovered by the first opening, and a first gate region replacing a first portion of a transition layer of the dielectric layers uncovered by the first opening. As another example, the second vertical channel structure can have a second source region being in contact with a vertical sidewall of the first metal layer uncovered by the second opening, a second drain region being in contact with a vertical sidewall of the second metal layer uncovered by the second opening, and a second gate region replacing a second portion of the transition layer uncovered by the second opening. In an embodiment, the transition layer can be separated from the first metal by a first one of the dielectric layers and separated from the second metal layer by a second one of the dielectric layers.

In an embodiment, forming a first vertical channel structure can include: forming a first type channel material on the semiconductor layer of the substrate within the first opening until covering the vertical sidewall of the first metal layer to form the first source region of the first vertical channel structure; forming the first type channel material on the first source region within the first opening until covering the vertical sidewall of the second metal layer to form the first drain region of the first vertical channel structure; forming an opening to uncover vertical sidewalls of the multilayer stack surrounding the first vertical channel structure; and removing the transition layer and replacing with the first gate region. For example, the transition layer can be capable of being etched selectively with respect to the first and second dielectric layers, and removing the transition layer includes etching the transition layer.

In another embodiment, the first gate region can include a first gate material attached to and surrounding the first type channel material and a first metal material attached to and surrounding the first gate material.

Aspects of the present disclosure further provide a method of fabricating a semiconductor device. For example, the method can include forming an initial multilayer stack on a semiconductor layer. The initial multilayer stack can include at least two substacks that are stacked on each other and a transition layer that separates the substacks from each other. Each of the substacks can include alternate metal layers and dielectric layers. The method can also include forming at least one opening through the initial multilayer stack to uncover the semiconductor layer, and forming at least two vertical channel structures within the opening that are stacked on each other. Each of the vertical channel structures can extend through a respective one of the substacks and have source and drain regions being in contact with the metal layers of the respective substack. The method can also include dividing the initial multilayer stack into separate stacks that include the vertical channel structures surrounded by the substacks and the transition layer. The method can also include forming an isolation structure that electrically isolates the vertical channel structures.

In an embodiment, forming at least two vertical channel structures can include: forming a first type channel material on the semiconductor layer within the opening extending through a first one of the substacks; forming a sacrificial interface structure on the first type channel material that is aligned with the transition layer; and forming a second type channel material on the sacrificial interface structure within the opening extending through a second one of the substacks. For example, each of the substacks can further include a sacrificial gate layer sandwiched between two of the dielectric layers, and forming at least two vertical channel structures can further include removing the sacrificial gate layer and replacing with a gate material attached to and surrounding the vertical channel structures and a metal material attached to and surrounding the gate material. As another example, the sacrificial gate layer can be capable of being etched selectively with respect to the dielectric layers, and removing the sacrificial gate layer can include etching the sacrificial gate layer.

In another embodiment, forming an isolation structure can include removing the transition layer and the sacrificial interface structure to uncover a transition point between the vertical channel structures and forming the isolation structure at the transition point. For example, the transition layer can be capable of being etched selectively with respect to the dielectric layers of the substacks, and removing the transition layer can include etching the transition layer.

For example, the metal layers of the substacks can be made of different metal materials.

In yet another embodiment, the method can also include: providing a substrate, the substrate including a first semiconductor layer, a dielectric layer formed on the first semiconductor layer, and a second semiconductor layer formed on the dielectric layer; covering a first portion of the second semiconductor layer that corresponds to the semiconductor layer; and etching a second portion of the second semiconductor layer that is not covered and replacing with the dielectric layer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
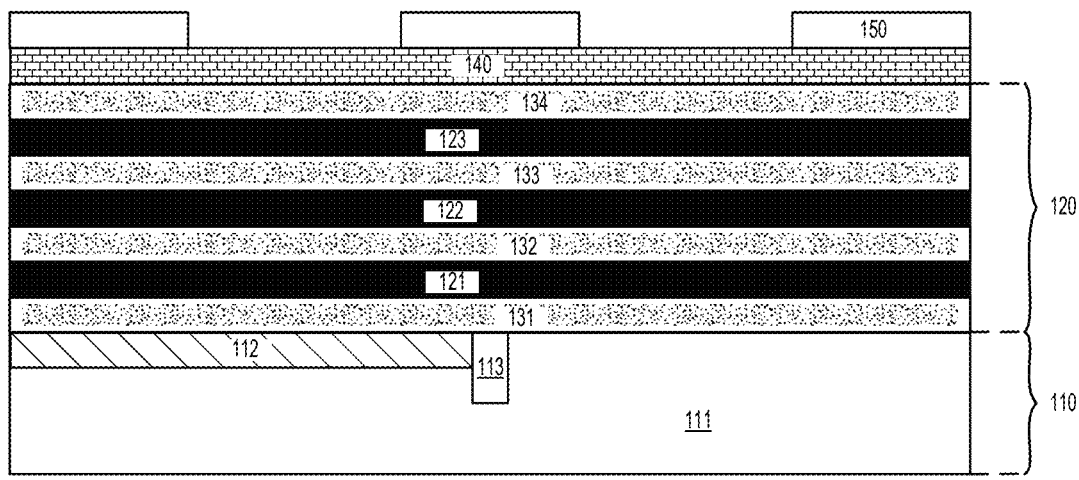
FIG. 1 is a cross-sectional view of an exemplary semiconductor device including a multilayer stack having alternate metal layers and dielectric layers according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array), SoC (System on chip)) is being pursued.

Exemplary embodiments here will be described with reference to the accompanying drawings. Embodiments having a universal or common 3D stack can enable 3D transistor stacking and 3D self-aligned metal enhancements with a same stack. These techniques can provide increased packing density for 3D circuits. There is a speed performance boost enabled due to close proximity and alignment to the adjacent metal connections. Self-aligned dual S/D metals are obtained for optimum NMOS and PMOS. High-performance source and drain regions are obtained. Enabled herein are different source, drain, and gate electrodes defined by layers within an initial layer stack. N tall 3D devices can be formed with techniques herein.

Embodiments herein are described with several process flows.

A first process flow (FIGS. 1-8) describes a multilayer stack that is used for NMOS and PMOS with 3D metal self-aligned to source, gate and drain regions with sequential epitaxial growth (side-by-side). A second process flow (FIGS. 9-16 and 16A) describes a multilayer stack that is used for NMOS and PMOS with 3D metal self-aligned connection to source, gate and drain regions combined with a dummy replacement gate electrode (side-by-side). A third process flow (FIGS. 17-24 and 24A) describes a multilayer stack with isolation between vertical channel structures and substrate device isolation (CFET stack) with 3D metal self-aligned to source, gate and drain regions. The combinations of the first to third process flows are contemplated herein as well as side-by-side device stacks.

FIG. 1 is a cross-sectional view of an exemplary semiconductor device 100 including a multilayer stack having alternate metal layers and dielectric layers according to some embodiments of the disclosure. In an embodiment, the semiconductor device 100 can include a substrate 110, a multilayer stack 120 formed (e.g., deposited) on the substrate 110, and an optional capping layer 140 formed on the multilayer stack 120. For example, the substrate 110 can be a wafer of any semiconductor material, e.g., Si, Ge and SiGe. In an embodiment, the substrate 110 can be processed to have a first type region 111, e.g., a P type region, in which P type dopants are doped, and a second type region 112, e.g., an N type region, that can be doped with N type dopants. A diffusion break (DB) 113 can be formed between the first type region 111 and the second type region 112 to prevent the P and N type dopants from being diffused into the N type region 112 and the P type region 111, respectively. The capping layer 140 can include a high-k material. The multilayer stack 120 can include alternate metal layers and dielectric layers.

For example, the multilayer stack 120 can include first to third metal layers 121-123 and first to fourth dielectric layers 131-134 that are alternate with the first to third metal layers 121-123. In an embodiment, the first to third metal layers 121-123 can provide connections and routing to source, gate and drain regions of two side-by-side vertical channel structures included in the semiconductor device 100. Each of the vertical channel structures can be FET devices in which a current flow travels perpendicular to a top surface of the substrate 110. The vertical channel structures can be of different channel types. A first etch mask 150 can be formed on the capping layer 140 and subsequently patterned using photolithography. The first etch mask 150 can be used to create openings in the multilayer stack 120 via, for example, etching, for future vertical channel structures to be formed (e.g., epitaxially grown) within. Materials for the first etch mask 150 can be organic or inorganic. Examples of organic materials for the first etch mask 150 can include amorphous carbon or organo siloxane-based materials with reflection control properties, among others. The organic first etch mask 150 can be formed by chemical vapor deposition (CVD) or spin-on processes. Examples of inorganic materials for the first etch mask 150 can include SiN, SiON or TiN, among others. The inorganic first etch mask 150 can be deposited through CVD process.

Figure 2:
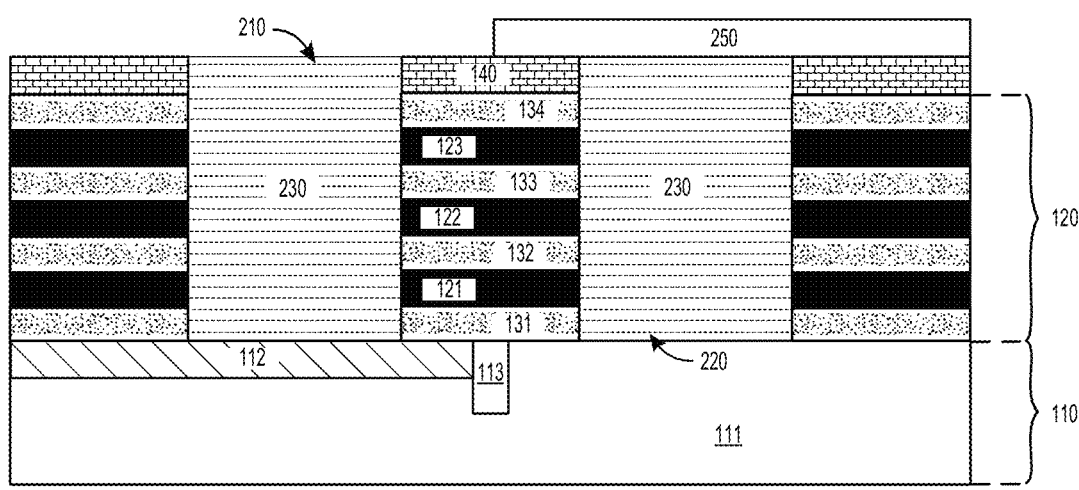
FIG. 2 is a cross-sectional view illustrating etching of the multilayer stack of the exemplary semiconductor device according to some embodiments of the disclosure.

FIG. 2 is a cross-sectional view illustrating etching of the multilayer stack 120 of the exemplary semiconductor device 100 according to some embodiments of the disclosure. An etching process can be performed and a portion of the multilayer stack 120 that is not protected by the first etch mask 150 can be etched to form openings, e.g., a first opening 210 and a second opening 220, through the multilayer stack 120 until uncovering a top surface of the substrate 110, for vertical channel structures to be formed within. For example, the first opening 210 can uncover the second type region 112, while the second opening 220 can uncover the first type region 111. In an embodiment, a semiconductor layer, e.g., a semi-conductive material, can be formed (e.g., epitaxially grown) on the substrate 110, and the first opening 210 and the second opening 220 can be formed to uncover the semiconductor layer within the second and first type regions 112 and 111, respectively. The first etch mask 150 can be removed and the multilayer stack 120 can be cleaned. The first opening 210 and the second opening 220 can then be filled with a dielectric material 230. A second etch mask 250 can be formed and subsequently patterned using photolithography to mask the dielectric material 230 filled in the second opening 220, with the dielectric layer 230 filled in the first opening 210 unmasked.

Figure 3:
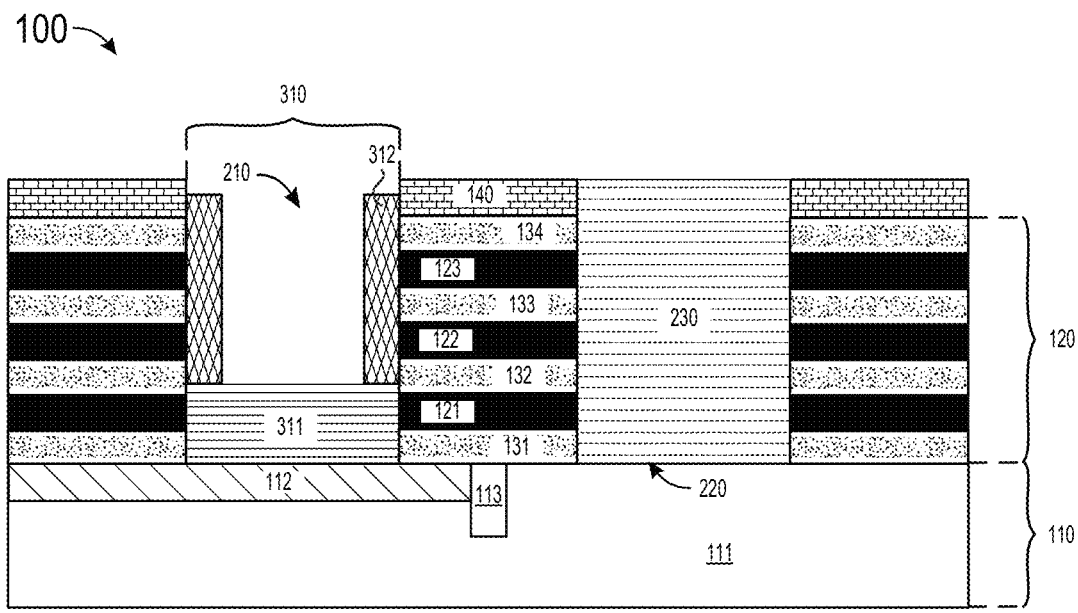
FIG. 3 is a cross-sectional view illustrating initial formation of a first vertical channel structure of the exemplary semiconductor device according to some embodiments of the disclosure.

FIG. 3 is a cross-sectional view illustrating initial formation of a first vertical channel structure 310 of the exemplary semiconductor device 100 according to some embodiments of the disclosure. An etching process can be performed and the dielectric layer 230 filled in the first opening 210, which is not protected by the second etch mask 250, can be etched to uncover the second type region 112, for the first vertical channel structure 310 to be formed within. The second etch mask 250 can then be removed. A first type channel material, e.g., a P+ material, can be formed (e.g., epitaxial grown) on the N type region 112 until covering the first metal layer 121 of the multilayer stack 120, to form a first source region 311 of the first vertical channel structure 310. The first source region 311 of the first vertical channel structure 310 can thus cover a vertical sidewall of the first metal layer 121 and be attached to or in contact with the first metal layer 121. The P+ epitaxial material can be stopped before reaching the second metal layer 122 of the multilayer stack 120. For example, the P+ epitaxial material can cover at least a portion of the second dielectric layer 132. A first gate material 312, e.g., a high-k dielectric material, can be formed (e.g., deposited) on the first source region 311 until covering vertical sidewalls of the second and third metal layers 122 and 123 and the second to fourth dielectric layers 132-134 of the multilayer stack 120.

Figure 4:
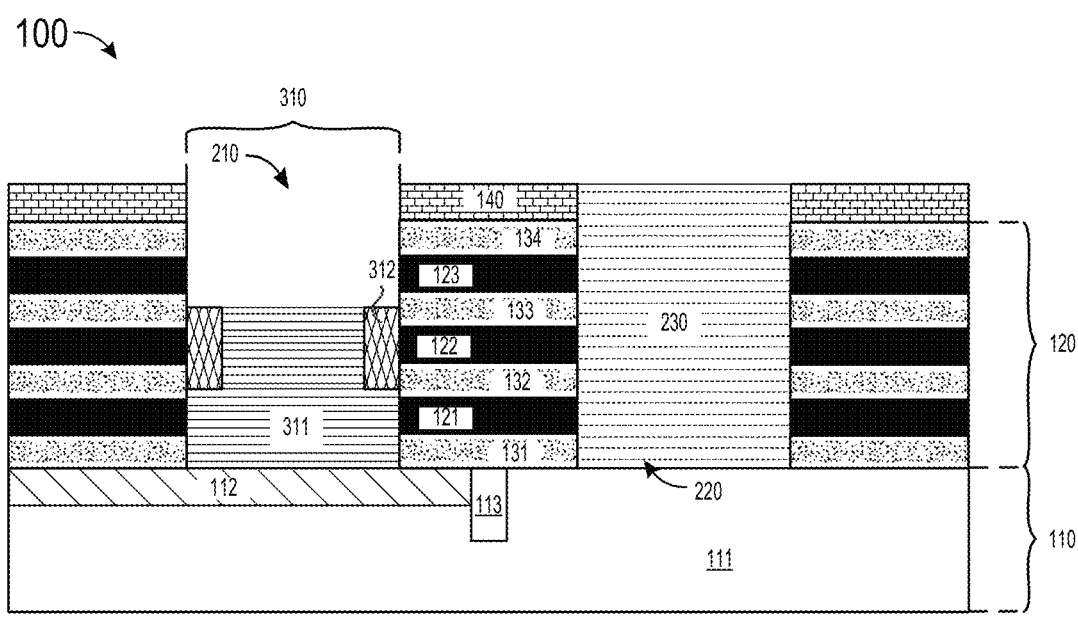
FIG. 4 is a cross-sectional view illustrating continuous formation of the first vertical channel structure of the exemplary semiconductor device according to some embodiments of the disclosure.

FIG. 4 is a cross-sectional view illustrating continuous formation of the first vertical channel structure 310 of the exemplary semiconductor device 100 according to some embodiments of the disclosure. The P+ epitaxial material can then be grown continuously before reaching the third metal layer 123 of the multilayer stack 120. The first gate material 312 can be etched to uncover the third metal layer 123. That is, a portion of the first gate material 312 that is higher than the P+ epitaxial material can be removed, so that a first gate region 312 of the first vertical channel structure 310 can cover the vertical sidewall of the second metal layer 122.

Figure 5:
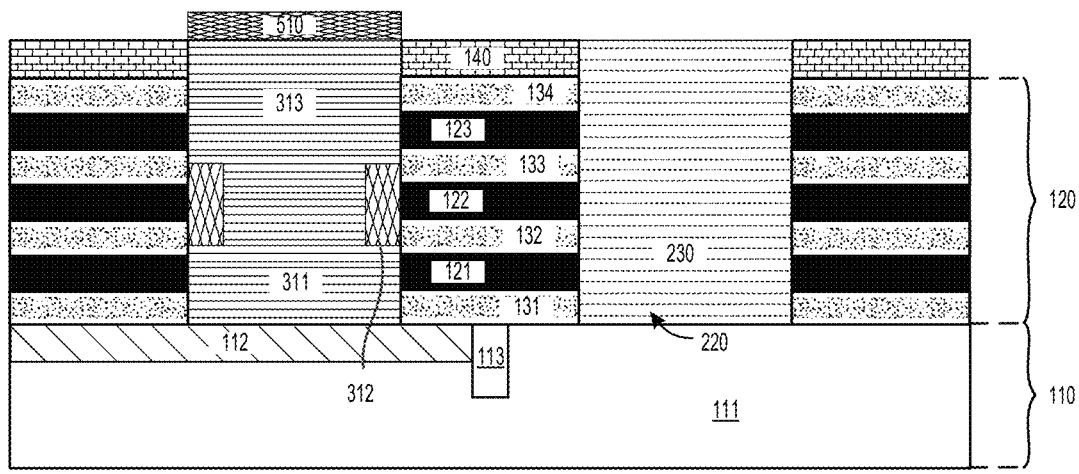
FIG. 5 is a cross-sectional view illustrating complete formation of the first vertical channel structure of the exemplary semiconductor device according to some embodiments of the disclosure.

FIG. 5 is a cross-sectional view illustrating complete formation of the first vertical channel structure 310 of the exemplary semiconductor device 100 according to some embodiments of the disclosure. A first drain region 313 of the first vertical channel structure 310 can be formed by growing the P+ epitaxial material again in the first opening 210 to finish filling the first opening 210 or to cover the third metal layer 123 of the multilayer stack 120. The first drain region 313 can cover a vertical sidewall of the third metal layer 123. In an embodiment, the first drain region 313 can also cover at least a portion of the third dielectric layer 133 that is between the second metal layer 122 and the third metal layer 123. In another embodiment, the first drain region 313 can also cover at least a portion of the fourth dielectric layer 134 that is above the third metal layer 123. The formation of the first vertical channel structure 310, e.g., a PMOS device 310, can be complete. A protective cap 510, e.g., a high-k dielectric material, can be optionally formed (e.g., deposited) to cover and protect the PMOS.

Figure 6:
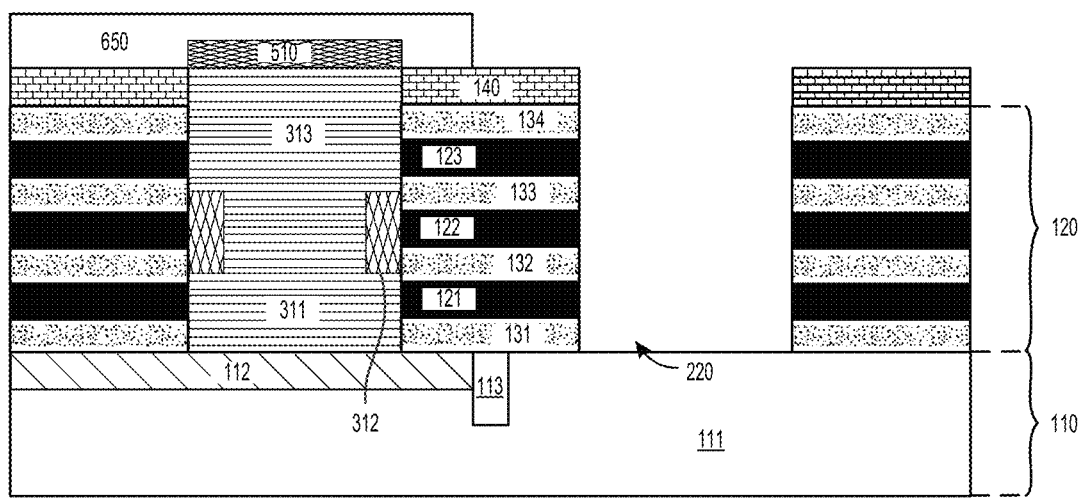
FIG. 6 is a cross-sectional view illustrating initial formation of a second vertical channel structure of the exemplary semiconductor device according to some embodiments of the disclosure.

FIG. 6 is a cross-sectional view illustrating initial formation of a second vertical channel structure 720 (shown in FIGS. 7 and 8) of the exemplary semiconductor device 100 according to some embodiments of the disclosure. A third etch mask 650 can be formed to mask the PMOS device 310 and subsequently patterned using photolithography. An etching process can be performed and the dielectric layer 230 filled in the second opening 220, which is not protected by the third etch mask 650, can be etched to uncover the first type region 111, for the second vertical channel structure 720 to be formed within. The third etch mask 650 can then be removed.

Figure 7:
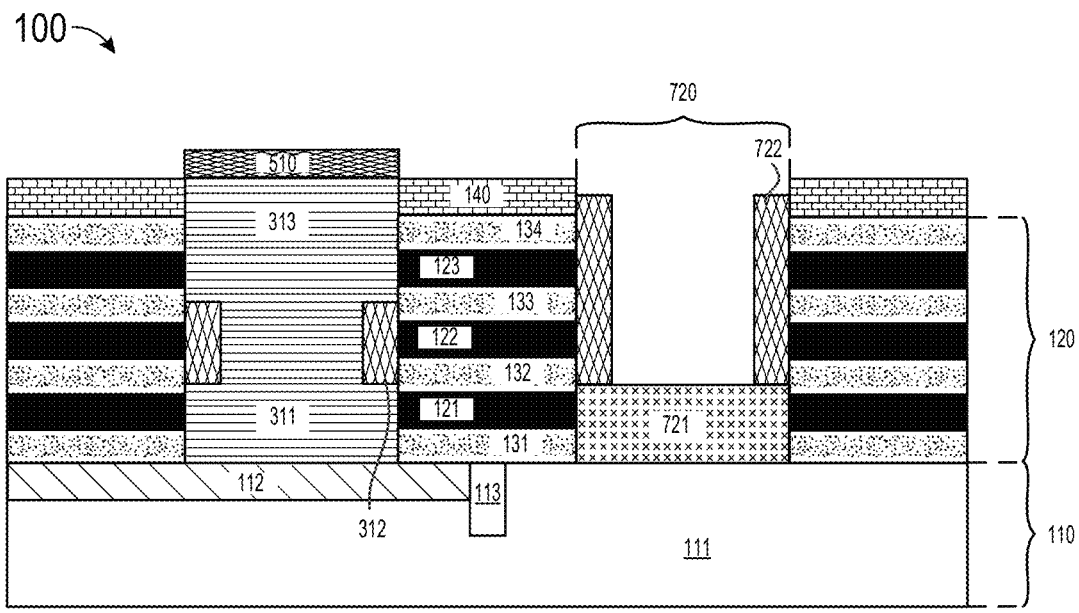
FIG. 7 is a cross-sectional view illustrating continuous formation of the second vertical channel structure of the exemplary semiconductor device according to some embodiments of the disclosure.

FIG. 7 is a cross-sectional view illustrating continuous formation of the second vertical channel structure 720 of the exemplary semiconductor device 100 according to some embodiments of the disclosure. A second type channel material, e.g., an N− material, can be formed (e.g., epitaxial grown) on the P type region 111 until covering a vertical sidewall of the first metal layer 121 of the multilayer stack 120 uncovered by the second opening 220, to form a second source region 721 of the second vertical channel structure 720. The second source region 721 of the second vertical channel structure 720 can thus cover the vertical sidewall of the first metal layer 121 and be attached to or in contact with the first metal layer 121. The N− epitaxial material can be stopped before reaching the second metal layer 122 of the multilayer stack 120. For example, the N− epitaxial material can cover at least a portion of the second dielectric layer 132. A second gate material 722, e.g., a high-k dielectric material, can be formed (e.g., deposited) on the second source region 721 to cover vertical sidewalls of the second and third metal layers 122 and 123 and the second to fourth dielectric layers 132-134 of the multilayer stack 120. For example, the first gate material 312 and the second gate material 722 can be the same. As another example, the first gate material 312 and the second gate material 722 can be different.

Figure 8:
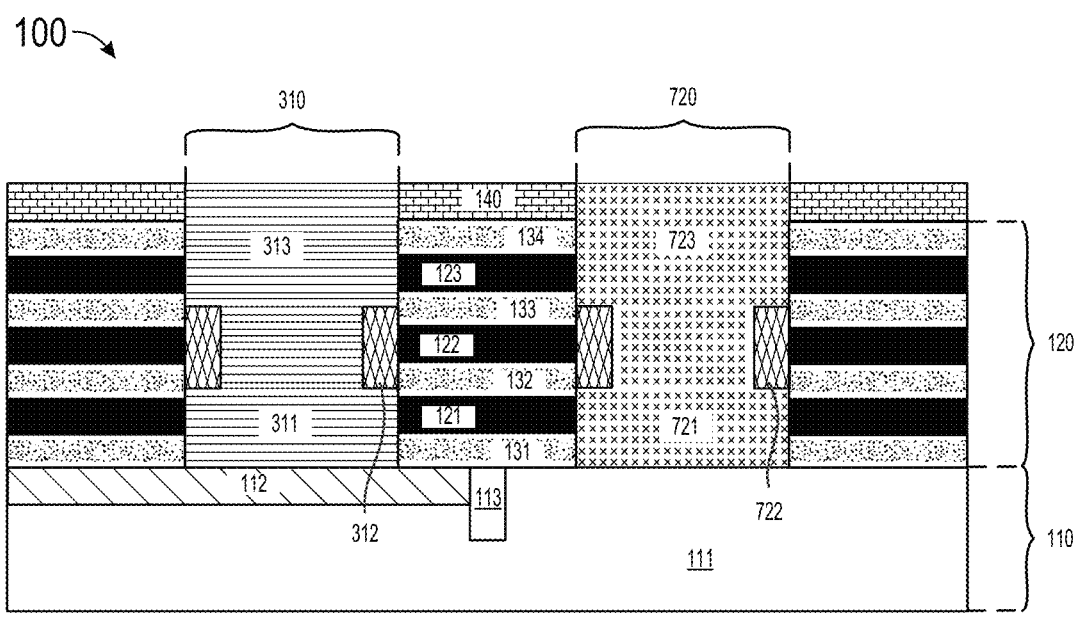
FIG. 8 is a cross-sectional view illustrating complete formation of the second vertical channel structure of the exemplary semiconductor device according to some embodiments of the disclosure.

FIG. 8 is a cross-sectional view illustrating complete formation of the second vertical channel structure 720 of the exemplary semiconductor device 100 according to some embodiments of the disclosure. The N− epitaxial material can then be grown continuously before reaching the third metal layer 123 of the multilayer stack 120. The second gate material 722 can be etched to uncover the third metal layer 123. That is, a portion of the second gate material 722 that is higher than the N− epitaxial material can be removed, so that a second gate region 722 of the second vertical channel structure 720 can cover the vertical sidewall of the second metal layer 122. A second drain region 723 of the second vertical channel structure 720 can be formed by growing the N− epitaxial material again in the second opening 220 to finish filling the second opening 220 or to cover the third metal layer 123 of the multilayer stack 120. The second drain region 723 can cover a vertical sidewall of the third metal layer 123. In an embodiment, the second drain region 723 can also cover at least a portion of the third dielectric layer 133 that is between the second metal layer 122 and the third metal layer 123. In another embodiment, the second drain region 723 can also cover at least a portion of the fourth dielectric layer 134 that is above the third metal layer 123. The formation of the second vertical channel structure 720, e.g., an NMOS device 720, can be complete. As can be seen in FIG. 8, a vertical channel FET can be formed with the first to third metal layers 121-123 of the multilayer stack 120 connecting to its respective source, gate and drain regions. This can enable easier electrical hook up of transistor devices.

The second process flow describes a multilayer stack that is used for NMOS and PMOS with 3D metal self-aligned connection to source, gate and drain regions combined with a dummy replacement gate electrode (side-by-side).

Figure 9:
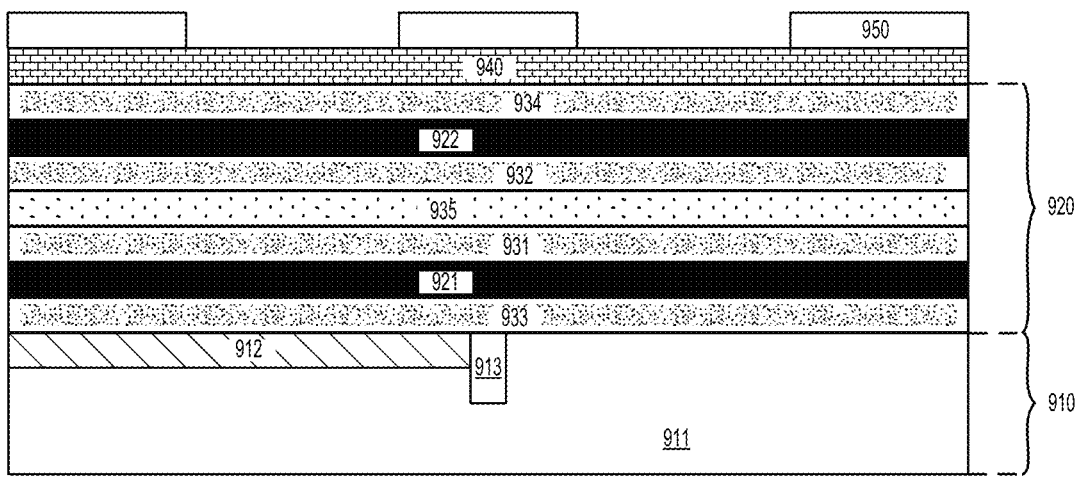
FIG. 9 is a cross-sectional view of another exemplary semiconductor device including a multilayer stack having dielectric layers according to some embodiments of the disclosure.

FIG. 9 is a cross-sectional view of an exemplary semiconductor device 900 including a multilayer stack having dielectric layers according to some embodiments of the disclosure. In an embodiment, the semiconductor device 900 can include a substrate 910, a multilayer stack 920 formed (e.g., deposited) on the substrate 910, and an optional capping layer 940 formed on the multilayer stack 920. For example, the substrate 910 can be a wafer of any semiconductor material, e.g., Si, Ge and SiGe. In an embodiment, the substrate 910 can be processed to have a first type region 911, e.g., a P type region, in which P type dopants are doped, and a second type region 912, e.g., an N type region, that can be doped with N type dopants. A DB 913 can be formed between the first type region 911 and the second type region 912 to prevent the P and N type dopants from being diffused into the N type region 912 and the P type region 911, respectively. The capping layer 940 can include a high-k dielectric material.

The multilayer stack 920 can include alternate metal layers and dielectric layers. For example, the metal layers can include first and second metal layers 921 and 922, and the dielectric layers can include first to fourth dielectric layers 931-934 and a transition layer 935. In an embodiment, the first dielectric layer 931 can be formed between the first metal layer 921 and the transition layer 935, and the second dielectric layer 932 can be formed between the second metal layer 922 and the transition layer 935. In another embodiment, the transition layer 935 can be etched selectively with respect to the first to fourth dielectric layers 931-934. That is, any predetermined dielectric of the dielectric layers can be etched without substantially etching the remaining dielectric materials. For example, the transition layer 935 can be chosen to have selectivity to a predetermined etchant while the first to fourth dielectric layers 931-934 are not selective to the predetermined etchant. It may be appreciated by those in the art that material etch selectivities are generally known. In an embodiment, the first and second metal layers 921 and 922 can provide connections and routing to source and drain regions of two side-by-side vertical channel structures included in the semiconductor device 900. Each of the vertical channel structures can be FET devices in which a current flow travels perpendicular to a top surface of the substrate 910. The vertical channel structures can be of different channel types.

A first etch mask 950 can be formed on the capping layer 940 and subsequently patterned using photolithography. The first etch mask 950 can be used to create openings in the multilayer stack 920 via, for example, etching, for future vertical channel structures to be formed (e.g., epitaxially grown) within. Materials for the first etch mask 950 can be organic or inorganic. Examples of organic materials for the first etch mask 950 can include amorphous carbon or organo siloxane-based materials with reflection control properties, among others. The organic first etch mask 950 can be formed by chemical vapor deposition (CVD) or spin-on processes. Examples of inorganic materials for the first etch mask 950 can include SiN, SiON or TiN, among others. The inorganic first etch mask 950 can be deposited through CVD process.

Figure 10:
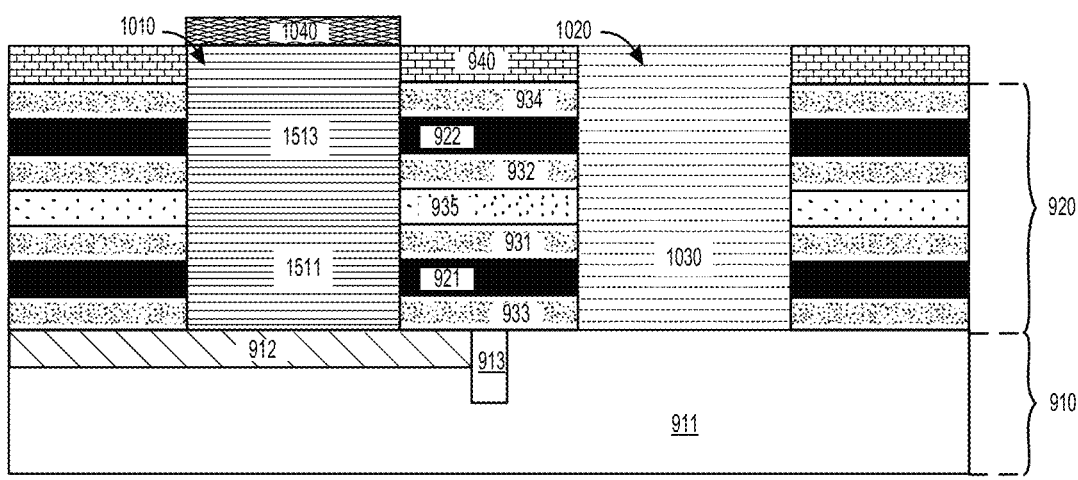
FIG. 10 is a cross-sectional view illustrating initial formation of a first vertical channel structure of the exemplary semiconductor device according to some embodiments of the disclosure.

FIG. 10 is a cross-sectional view illustrating initial formation of a first vertical channel structure of the exemplary semiconductor device 900 according to some embodiments of the disclosure. An etching process can be performed and a portion of the multilayer stack 920 that is not protected by the first etch mask 950 can be etched to form openings, e.g., a first opening 1010 and a second opening 1020, through the multilayer stack 920 until uncovering a top surface of the substrate 910, for vertical channel structures to be formed within. For example, the first opening 1010 can uncover the second type region 912, while the second opening 1020 can uncover the first type region 911. In an embodiment, a semiconductor layer, e.g., a semi-conductive material, can be formed (e.g., epitaxially grown) on the substrate 910, and the first opening 1010 and the second opening 1020 can be formed to uncover the semiconductor layer within the second and first type regions 912 and 911, respectively. The first etch mask 950 can be removed and the multilayer stack 920 can be cleaned. The first opening 1010 and the second opening 1020 can then be filled with a dielectric material 1030.

Similar to the process shown in FIG. 2, a second etch mask (not shown) can be formed and subsequently patterned using photolithography to mask the dielectric material 1030 filled in the second opening 1020, with the dielectric layer 1030 filled in the first opening 1010 unmasked. An etching process can be performed and the dielectric layer 1030 filled in the first opening 1010, which is not protected by the second etch mask, can be etched to uncover the second type region 912, for a first vertical channel structure 1510 (see FIGS. 15 and 16) to be formed within. The second etch mask can then be removed. A first type channel material, e.g., a P+ material, can be formed (e.g., epitaxial grown) on the N type region 912 until covering vertical sidewalls of the multilayer stack 920 that are uncovered by the first opening 1010, to form a first source region 1511 and a first drain region 1513 of the first vertical channel structure 1510. The first source region 1511 of the first vertical channel structure 1510 can cover a vertical sidewall of the first metal layer 921 and be attached to or in contact with the first metal layer 921. The first drain region 1513 of the first vertical channel structure 1510 can cover a vertical sidewall of the second metal layer 922 and be attached to or in contact with the second metal layer 922. A first protective cap 1040, e.g., a high-k dielectric material, can be optionally formed (e.g., deposited) to cover and protect the PMOS.

Figure 11:
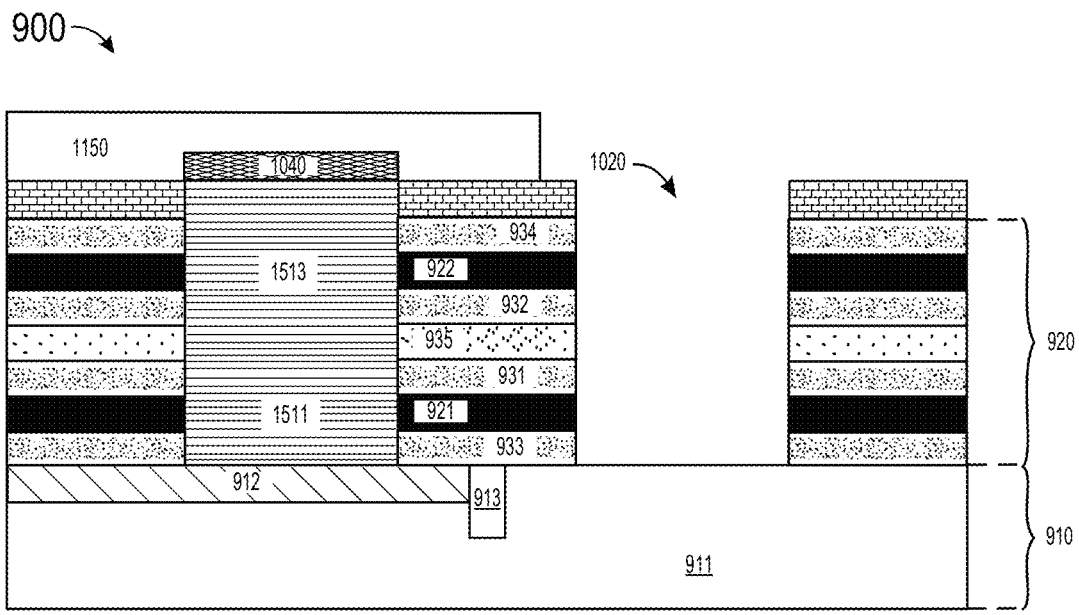
FIG. 11 is a cross-sectional view illustrating initial formation of a second vertical channel structure of the exemplary semiconductor device according to some embodiments of the disclosure.

FIG. 11 is a cross-sectional view illustrating initial formation of a second vertical channel structure of the exemplary semiconductor device 900 according to some embodiments of the disclosure. A third etch mask 1150 can be formed to mask the PMOS device 1510 and subsequently patterned using photolithography. An etching process can be performed and the dielectric layer 1030 filled in the second opening 1020, which is not protected by the third etch mask 1150, can be etched to uncover the first type region 911, for a second vertical channel structure 1620 (see FIG. 16) to be formed within. The third etch mask 1150 can then be removed.

Figure 12:
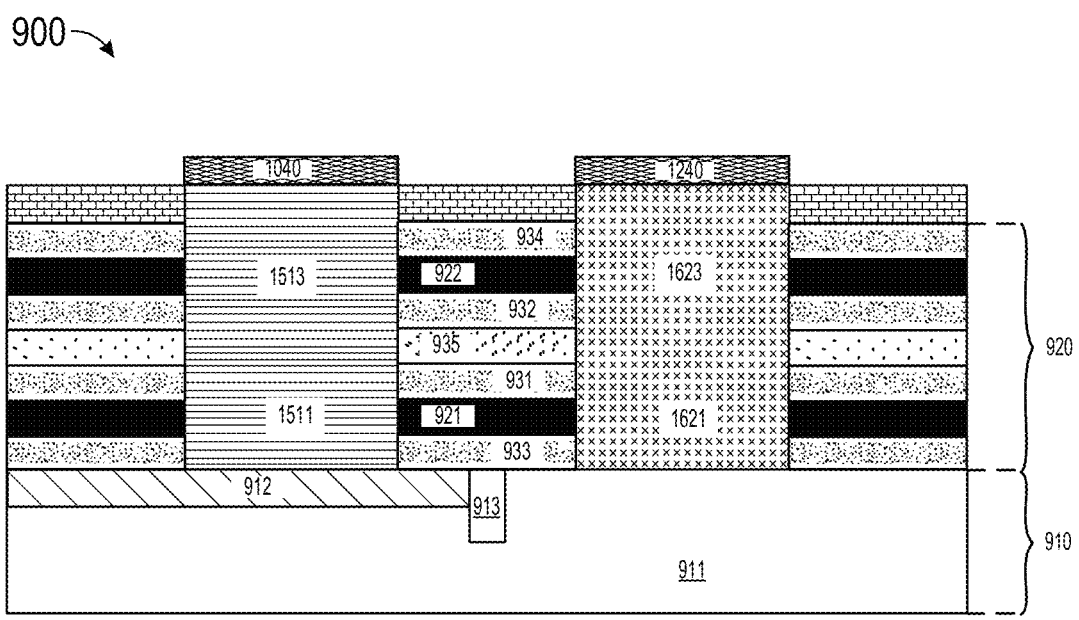
FIG. 12 is a cross-sectional view illustrating continuous formation of the second vertical channel structure of the exemplary semiconductor device according to some embodiments of the disclosure.

FIG. 12 is a cross-sectional view illustrating continuous formation of the second vertical channel structure 1620 of the exemplary semiconductor device 900 according to some embodiments of the disclosure. A second type channel material, e.g., an N− material, can be formed (e.g., epitaxial grown) on the P type region 911 until covering vertical sidewalls of the multilayer stack 920 that are uncovered by the second opening 1020, to form a second source region 1621 and a second drain region 1623 of the second vertical channel structure 1620. The second source region 1621 of the second vertical channel structure 1620 can cover a vertical sidewall of the first metal layer 921 that is uncovered by the second opening 1020, and be attached to or in contact with the first metal layer 921. The second drain region 1623 of the second vertical channel structure 1620 can cover a vertical sidewall of the second metal layer 922 that is uncovered by the second opening 1020, and be attached to or in contact with the second metal layer 922. A second protective cap 1240, e.g., a high-k dielectric material, can be optionally formed (e.g., deposited) to cover and protect the NMOS.

Figure 13:
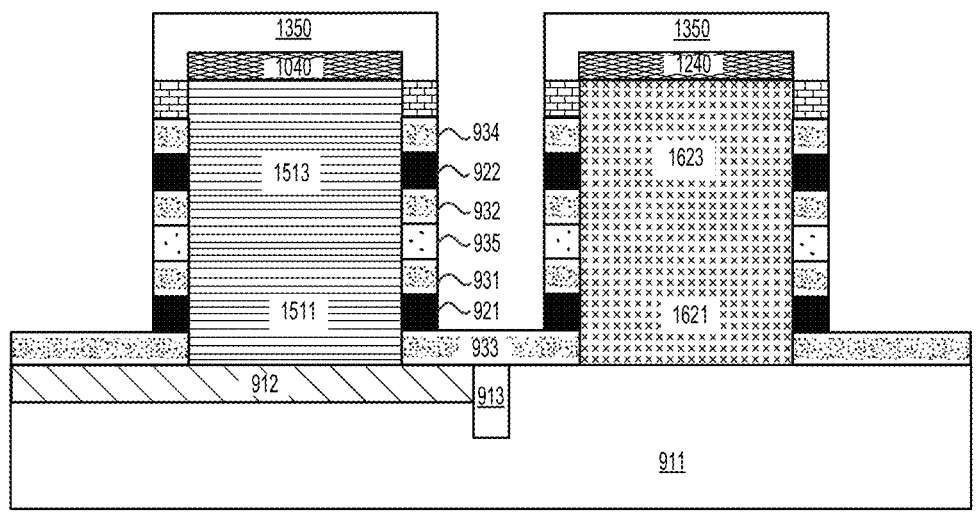
FIG. 13 is a cross-sectional view illustrating continuous formation of the first and second vertical channel structures of the exemplary semiconductor device according to some embodiments of the disclosure.

FIG. 13 is a cross-sectional view illustrating continuous formation of the first and second vertical channel structures 1510 and 1620 of the exemplary semiconductor device 900 according to some embodiments of the disclosure. A fourth etch mask 1350 can be formed on the first and second protective caps 1040 and 1240 and subsequently patterned using photolithography. The fourth etch mask 1350 can be used to create openings in the multilayer stack 920 via, for example, etching, to expose vertical sidewalls (e.g., vertical sidewall structures) of the multilayer stack 920 surrounding the first and second vertical channel structures 1510 and 1620. An etching process can be performed and the openings are created that uncover the vertical sidewalls of the multilayer stack 920. In an embodiment, the openings can also uncover the third dielectric layer 933 of the multilayer stack 920.

Figure 14:
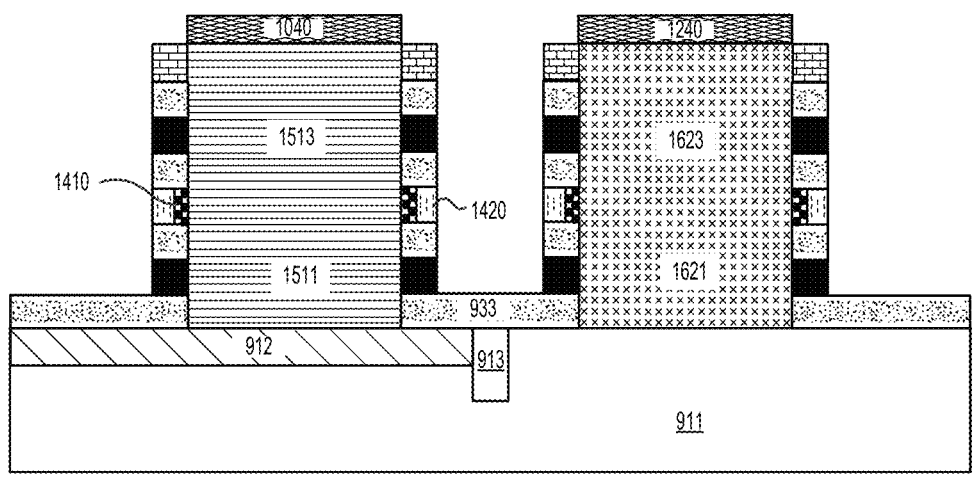
FIG. 14 is a cross-sectional view illustrating continuous formation of the first and second vertical channel structures of the exemplary semiconductor device according to some embodiments of the disclosure.

FIG. 14 is a cross-sectional view illustrating continuous formation of the first and second vertical channel structures 1510 and 1620 of the exemplary semiconductor device 900 according to some embodiments of the disclosure. The fourth etch mask 1350 can be removed. The transition layer 935 can be etched and removed. For example, the transition layer 935 can be etched by isotropic etching such as vapor-phase etching. As the transition layer 935 can be etched selectively with respect to the first to fourth dielectric layers 931-934, when the transition layer 935 is etched, the first to fourth dielectric layers 931-934 will not be etched or substantially etched. The transition layer 935 can be replaced with a gate material 1410 surrounding the first and second vertical channel structures 1510 and 1620 and a dummy gate material 1420 surrounding the gate material 1410. For example, the gate material 1410 can be a high-k dielectric material. As another example, the dummy gate material 1420 can be any insulator, metal or semiconductor material that can be etched selectively with respect to the first and second metal layers 921 and 922 and the first to fourth dielectric layers 931-934 of the multilayer stack 920. Material choice here is flexible because high-temperature steps have been previously completed. The dummy gate material 1420 can be used for making different gate stacks for NMOS and PMOS devices.

Figure 15:
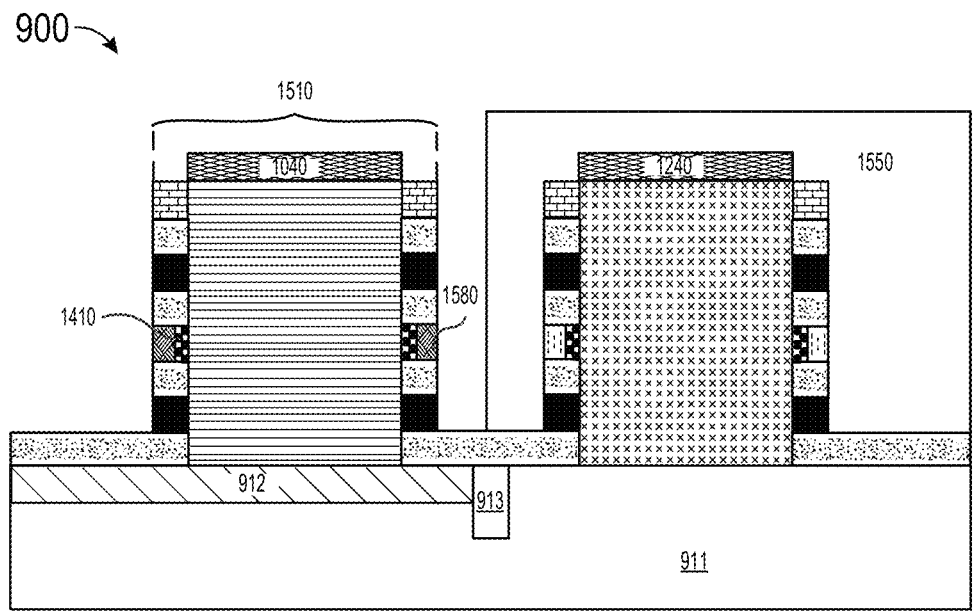
FIG. 15 is a cross-sectional view illustrating complete formation of the first vertical channel structure of the exemplary semiconductor device according to some embodiments of the disclosure.

FIG. 15 is a cross-sectional view illustrating complete formation of the first vertical channel structure 1510 of the exemplary semiconductor device 900 according to some embodiments of the disclosure. A fifth etch mask 1550 can be formed to cover the NMOS 1620. An etching process can be performed, and the dummy gate material 1420 of the PMOS 1510 that is not protected by the fifth etch mask 1550 can be etched and replaced by a first metal material 1580.

Figure 16:
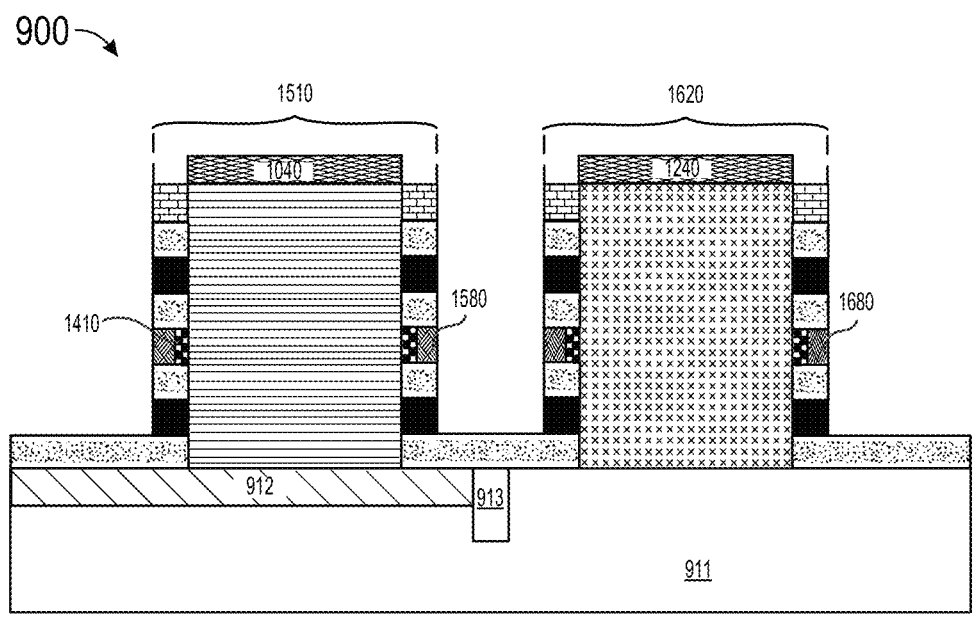
FIG. 16 is a cross-sectional view illustrating complete formation of the second vertical channel structure of the exemplary semiconductor device according to some embodiments of the disclosure.

FIG. 16 is a cross-sectional view illustrating complete formation of the second vertical channel structure 1620 of the exemplary semiconductor device 900 according to some embodiments of the disclosure. Similarly, a sixth etch mask (not shown) can be formed to cover the PMOS 1510. An etching process can be performed, and the dummy gate material 1420 of the NMOS 1620 that is not protected by the sixth etch mask can be etched and replaced by a second metal material 1680. For example, the first metal material 1580 and the second metal material 1680 can be the same. As another example, the first metal material 1580 and the second metal material 1680 can be different.

Figure 16A:
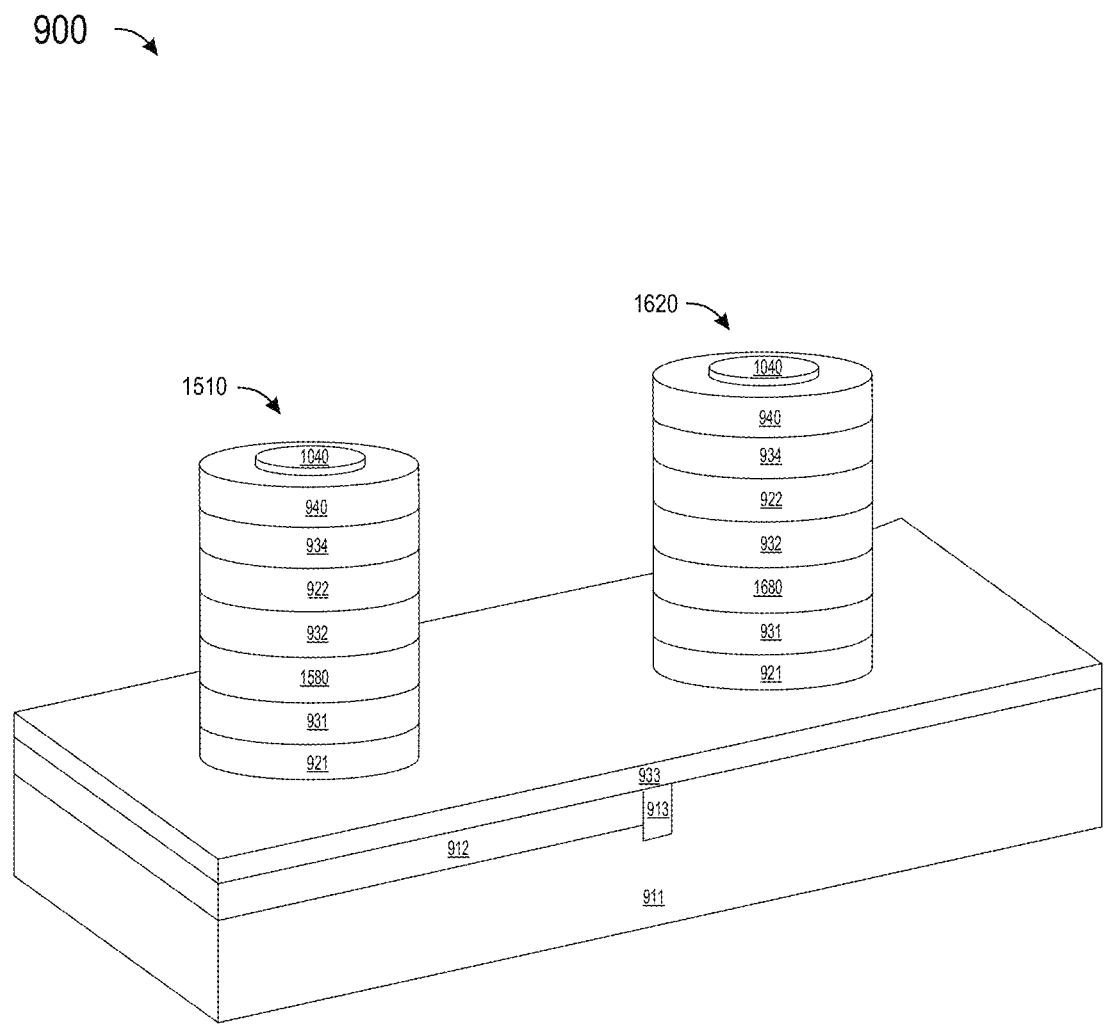
FIG. 16A shows a schematic diagram of the 3D exemplary semiconductor device of FIG. 16.

FIG. 16A shows a schematic diagram of the 3D exemplary semiconductor device 900 of FIG. 16. While the exemplary semiconductor device 900 is shown to have two vertical channel structures, i.e., the first vertical channel structure 1510 and the second vertical channel structure 1620, it is understood that the exemplary semiconductor device 900 can typically include more than two vertical channel structures.

The third process flow describes a multilayer stack with isolation between vertical channel structures and substrate device isolation (CFET stack) with 3D metal self-aligned to source, gate and drain regions.

Figure 17:
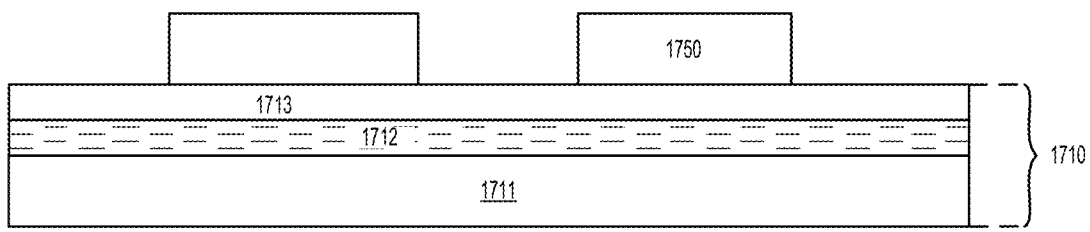
FIG. 17 is a cross-sectional view of yet another exemplary semiconductor device including a substrate according to some embodiments of the disclosure.

FIG. 17 is a cross-sectional view of an exemplary semiconductor device 1700 including a substrate 1710 according to some embodiments of the disclosure. For example, the substrate 170 can be a silicon-on-insulator (SOI) substrate. In an embodiment, the substrate 1710 can include a first semiconductor layer 1711, a dielectric layer 1712 formed on the first semiconductor layer 1711, and a second semiconductor layer 1713 formed on the dielectric layer 1712. For example, at least one of the first and second semiconductor layers 1711 and 1713 can include silicon or germanium. As another example, the dielectric layer 1712 can include oxide. A first etch mask 1750 can be formed on the second semiconductor layer 1712 and subsequently patterned using photolithography.

Figure 18:
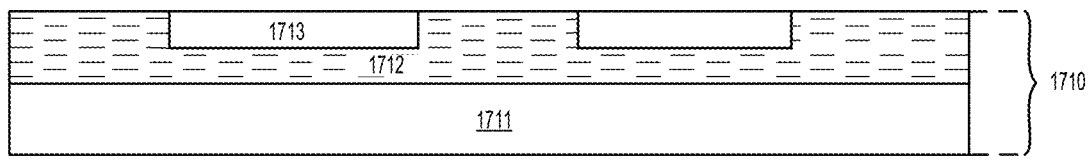
FIG. 18 is a cross-sectional view illustrating formation of a semiconductor layer of the exemplary semiconductor device according to some embodiments of the disclosure.

FIG. 18 is a cross-sectional view illustrating formation of a semiconductor layer of the exemplary semiconductor device 1700 according to some embodiments of the disclosure. An etching process can be performed and a portion of the second semiconductor layer 1713 that is not masked by the first etch mask 1750 can be etched until uncovering the dielectric layer 1712. This can leave silicon pads or regions 1713 on the dielectric layer 1712 to assist in forming vertical channel structures that can be electrically isolated from each other. The etched portion of the second semiconductor 1713 can be replaced with the dielectric layer 1712, e.g., an oxide. The substrate 1710 can then be planarized via, for example, chemical-mechanical polishing (CMP). This can leave the planar substrate 1710 with the silicon pads or regions 1713 isolated from each other.

Figure 19:
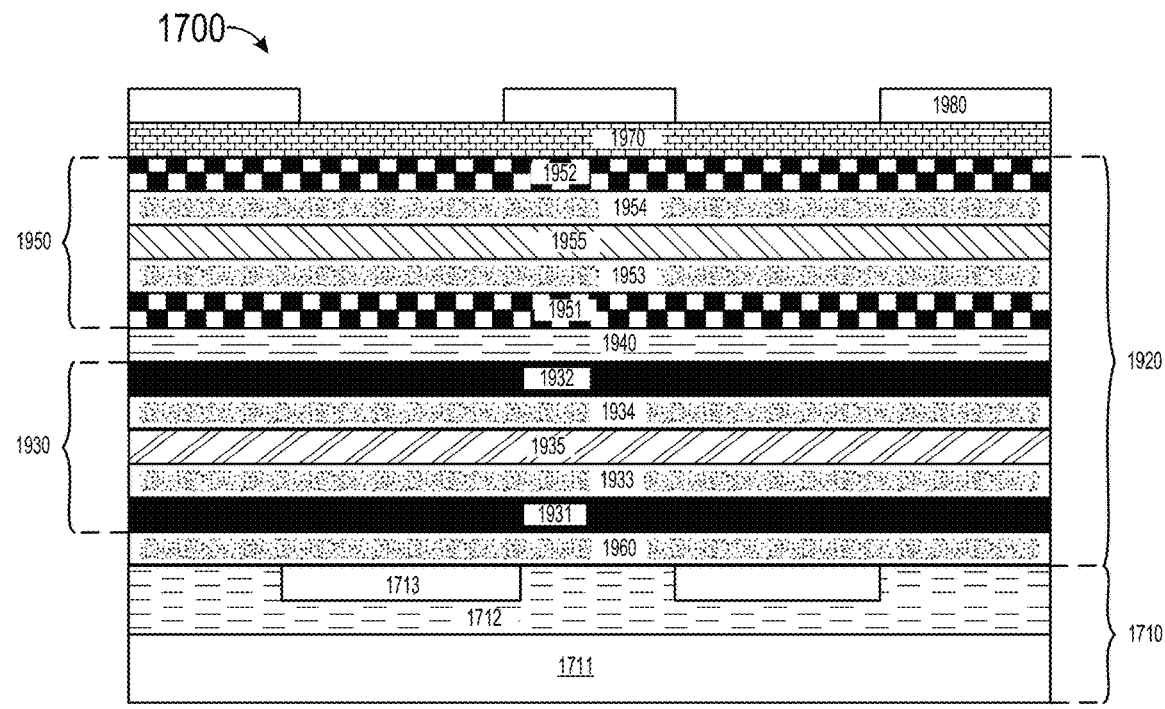
FIG. 19 is a cross-sectional view illustrating formation of a multilayer stack on the semiconductor layer of the substrate of the exemplary semiconductor device according to some embodiments of the disclosure.

FIG. 19 is a cross-sectional view illustrating formation of a multilayer stack 1920 on the semiconductor layer 1713 of the substrate 1710 of the exemplary semiconductor device 1700 according to some embodiments of the disclosure. The multilayer stack 1920 can include a dielectric layer 1960 formed on the semiconductor layer 1713 of the substrate 1710, a first substack 1930 formed on the dielectric layer 1960, a transition layer 1940 formed on the first substack 1930, and a second substack 1950 formed (e.g., deposited) on the transition layer 1940. Each of the first and second substacks 1930 and 1950 can include alternate metal layers and dielectric layers. In an embodiment, the transition layer 1940 and the dielectric layers of the first and second substacks 1930 and 1950 can be of multiple dielectric materials that are capable of being etched selectively with respect to each other. That is, any predetermined dielectric of the dielectric materials can be etched without substantially etching the remaining dielectric materials. For example, the transition layer 1940 can be chosen to have selectivity to a predetermined etchant while the dielectric layers of the first and second substacks 1930 and 1950 are not selective to the predetermined etchant. It may be appreciated by those in the art that material etch selectivities are generally known.

In an embodiment, the first substack 1930 can include a first metal layer 1931, a first dielectric layer 1933 formed on the first metal layer 1931, a first sacrificial gate layer 1935 formed on the first dielectric layer 1933, a second dielectric layer 1934 formed on the first sacrificial gate layer 1935, and a second metal layer 1932 formed on the second dielectric layer 1934. That is, the first sacrificial gate layer 1935 can be sandwiched between two of the dielectric layers of the first substack 1930, i.e., the first dielectric layer 1933 and the second dielectric layer 1934. In an embodiment, the first sacrificial gate layer 1935 and the first and second dielectric layer 1933 and 1934 can be of multiple dielectric materials that are capable of being etched selectively with respect to each other. For example, the first sacrificial gate layer 1935 can be chosen to have selectivity to a predetermined etchant while the first and second dielectric layers 1933 and 1934 are not selective to the predetermined etchant.

In another embodiment, the second substack 1950 can include a first metal layer 1951, a first dielectric layer 1953 formed on the first metal layer 1951, a second sacrificial gate layer 1955 formed on the first dielectric layer 1953, a second dielectric layer 1954 formed on the second sacrificial gate layer 1955, and a second metal layer 1952 formed on the second dielectric layer 1954. That is, the second sacrificial gate layer 1955 can be sandwiched between two of the dielectric layers of the second substack 1950, i.e., the first dielectric layer 1953 and the second dielectric layer 1954. In an embodiment, the second sacrificial gate layer 1955 and the first and second dielectric layer 1953 and 1954 can be of multiple dielectric materials that are capable of being etched selectively with respect to each other. For example, the second sacrificial gate layer 1955 can be chosen to have selectivity to a predetermined etchant while the first and second dielectric layers 1953 and 1954 are not selective to the predetermined etchant.

In an embodiment, the first and second metal layers 1931 and 1932 of the first substack 1930 and the first and second metal layers 1951 and 1952 of the first substack 1950 can be made of the same metal material. In another embodiment, the first and second metal layers 1931 and 1932 of the first substack 1930 and the first and second metal layers 1951 and 1952 of the first substack 1950 can be made of different metal materials, as shown in FIG. 19.

An optional capping layer 1970 can be formed on the multilayer stack 1920. A second etch mask 1980 can be formed on the capping layer 1970 and subsequently patterned using photolithography.

Figure 20:
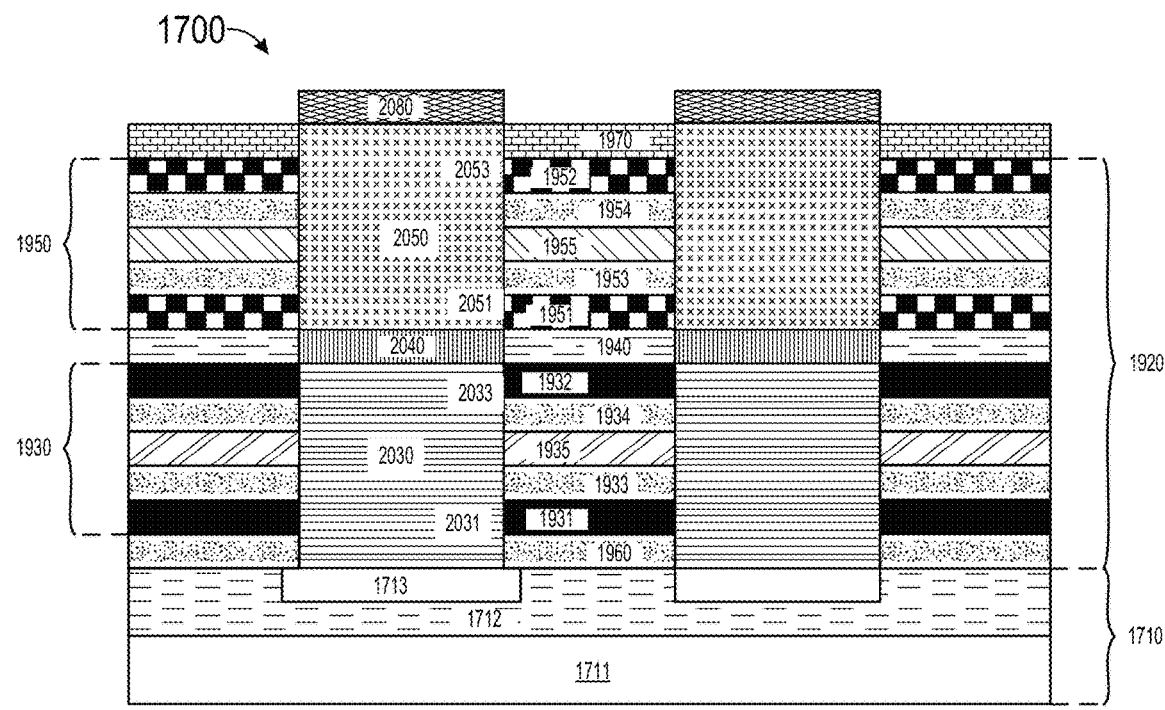
FIG. 20 is a cross-sectional view illustrating formation of vertical channel structures of the exemplary semiconductor device according to some embodiments of the disclosure.

FIG. 20 is a cross-sectional view illustrating formation of vertical channel structures of the exemplary semiconductor device 1700 according to some embodiments of the disclosure. An etching process can be performed and a portion of the multilayer stack 1920 that is not protected by the second etch mask 1980 can be etched to form at least one opening through the multilayer stack 1920 until uncovering a top surface of the substrate 1710, e.g., the semiconductor layer 1713 or the silicon pads or regions 1713, for the vertical channel structures to be formed within. The second etch mask 1980 can be removed and the multilayer stack 1920 can be cleaned. A first type channel material, e.g., a P type epitaxial material (or P+ epitaxial material), can be epitaxially grown on the semiconductor layer 1713 until covering vertical walls of the first substack 1930 to form a first vertical channel structure 2030. In an embodiment, the first vertical channel structure 2030 can include a first source region 2031 that covers a vertical sidewall of the first metal layer 1931 of the first substack 1930 and a first drain region 2033 that covers a vertical sidewall of the second metal layer 1932 of the first substack 1930. A sacrificial interface structure 2040, e.g., SiGe, can be formed (e.g., epitaxially grown) on the first vertical channel structure 2030. In an embodiment, the sacrificial interface structure 2040 can cover a vertical sidewall of the transition layer 1940 of the multilayer stack 1920. A second type channel material, e.g., an N type epitaxial material (or N− epitaxial material), can be epitaxially grown on the sacrificial interface structure 2040 until covering vertical walls of the second substack 1950 to form a second vertical channel structure 2050, which is stacked on the first vertical channel structure 2030. In an embodiment, the second vertical channel structure 2050 can include a second source region 2051 that covers a vertical sidewall of the first metal layer 1951 of the second substack 1950 and a second drain region 2053 that covers a vertical sidewall of the second metal layer 1952 of the second substack 1950. A protective cap 2080, e.g., a high-k dielectric material, can be optionally formed (e.g., deposited) to cover and protect the PMOS and NMOS.

Figure 21:
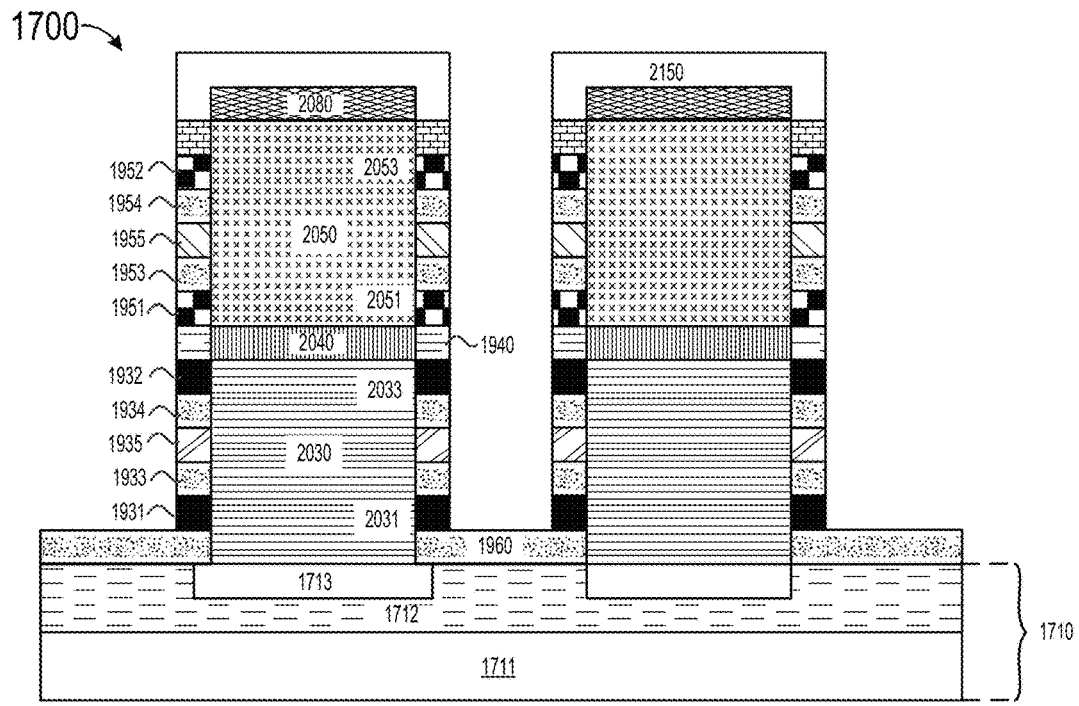
FIG. 21 is a cross-sectional view illustrating division of the multilayer stack of the exemplary semiconductor device according to some embodiments of the disclosure.

FIG. 21 is a cross-sectional view illustrating division of the multilayer stack 1920 of the exemplary semiconductor device 1700 according to some embodiments of the disclosure. A third etch mask 2150 can be formed to cover the PMOS and NMOS as well as the protective cap 2080. An etching process can be performed and a portion of the multilayer stack 1920 that is not protected by the third etch mask 2150 can be etched to form at least one vertical opening through the multilayer stack 1920 until uncovering the dielectric layer 1960 of the multilayer stack 1920 and a sidewall structure surrounding the first and second vertical channel structures 2030 and 2050.

Figure 22:
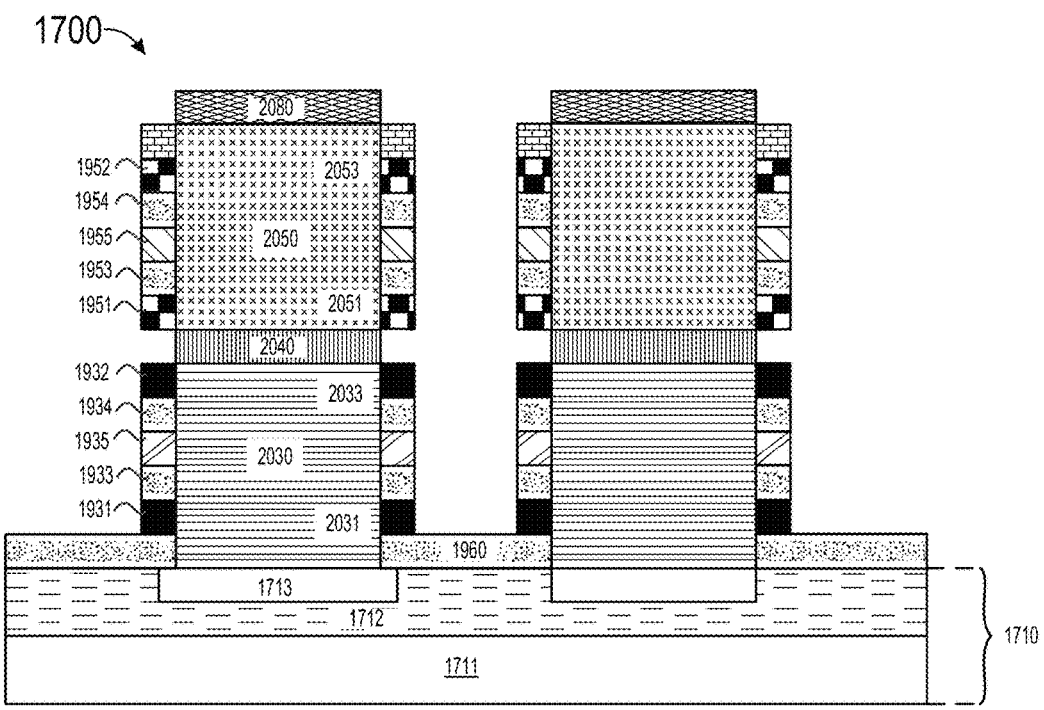
FIG. 22 is a cross-sectional view illustrating initial isolation of the first vertical channel structure from the second vertical channel structure of the exemplary semiconductor device according to some embodiments of the disclosure.

FIG. 22 is a cross-sectional view illustrating initial isolation of the first vertical channel structure 2030 from the second vertical channel structure 2050 of the exemplary semiconductor device 1700 according to some embodiments of the disclosure. The third etch mask 2150 can be removed and the multilayer stack 1920 can be cleaned. The transition layer 1940 can then be removed via, for example, by etching. As the transition layer 1940 can be etched selectively with respect to the first sacrificial gate layer 1935 and the first and second dielectric layers 1933 and 1934 of the first substack 1930 and the second sacrificial gate layer 1955 and the first and second dielectric layers 1953 and 1954 of the second substack 1950, when the transition layer 1940 is etched, the first sacrificial gate layer 1935 and the first and second dielectric layers 1933 and 1934 of the first substack 1930 and the second sacrificial gate layer 1955 and the first and second dielectric layers 1953 and 1954 of the second substack 1950 will not be etched or substantially etched.

Figure 23:
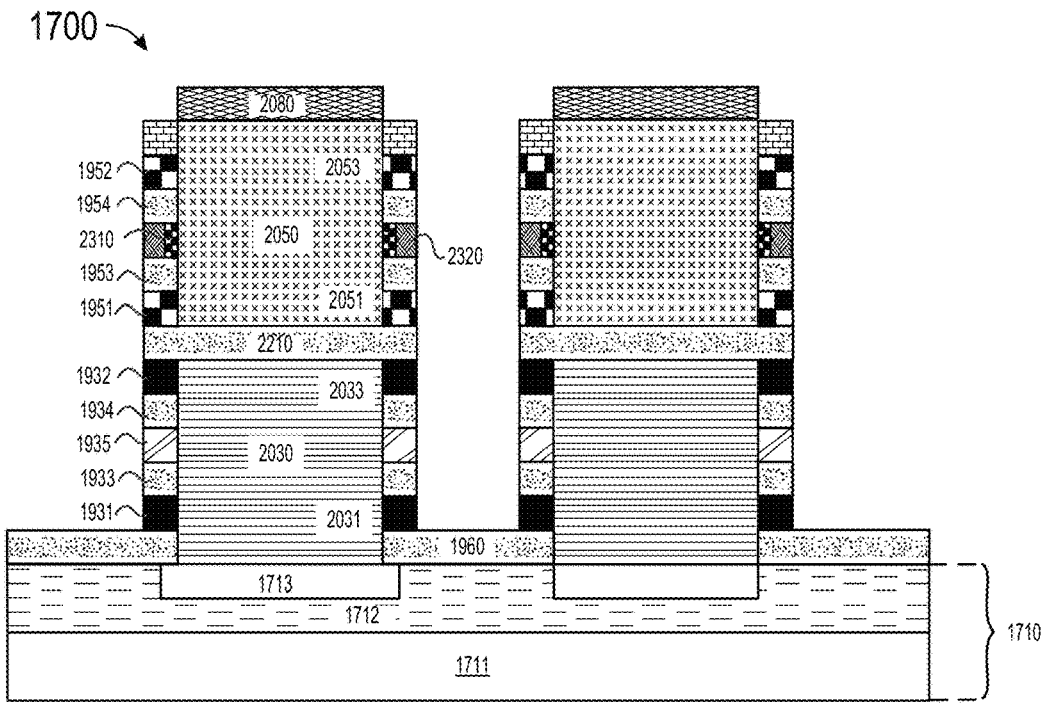
FIG. 23 is a cross-sectional view illustrating complete isolation of the first vertical channel structure from the second vertical channel structure of the exemplary semiconductor device according to some embodiments of the disclosure.

FIG. 23 is a cross-sectional view illustrating complete isolation of the first vertical channel structure 2030 from the second vertical channel structure 2050 of the exemplary semiconductor device 1700 according to some embodiments of the disclosure. After the transition layer 1940 is removed, the sacrificial interface structure 2040 can be removed via, for example, by etching, to uncover a transition point between the first vertical channel structure 2030 and the second vertical channel structure 2050. An isolation structure 2210 can then be formed (e.g., deposited) at the transition point. For example, the isolation structures 2210 can be made of silicon oxide, germanium oxide, and/or another electrical insulator and formed by oxidation and/or oxide deposition. The first and second vertical channel structures 2030 and 2050 that are stacked on each other and electrically isolated from each other with a multilayer stack sidewall structure can now be accessible for selective processing.

The second sacrificial gate layer 1955 can be removed via, for example, by etching. As the second sacrificial gate layer 1955 can be etched selectively with respect to the first sacrificial gate layer 1935 and the first and second dielectric layers 1933 and 1934 of the first substack 1930 and the first and second dielectric layers 1953 and 1954 of the second substack 1950, when the second sacrificial gate layer 1955 is etched, the first sacrificial gate layer 1935 and the first and second dielectric layers 1933 and 1934 of the first substack 1930 and the first and second dielectric layers 1953 and 1954 of the second substack 1950 will not be etched or substantially etched. A second gate material 2310 can be formed around the second vertical channel structure 2050. For example, the second gate material 2310 can be a high-k dielectric material. A second metal material 2320 can be formed around the second gate material 2310. For example, the second metal material 2320 can be work function metal (WFM). The second gate material 2310 and the second metal material 2320 can be referred to as a second gate region of the second vertical channel structure 2050. The gate-all-around (GAA) NMOS 2050 can be thus fabricated.

Figure 24:
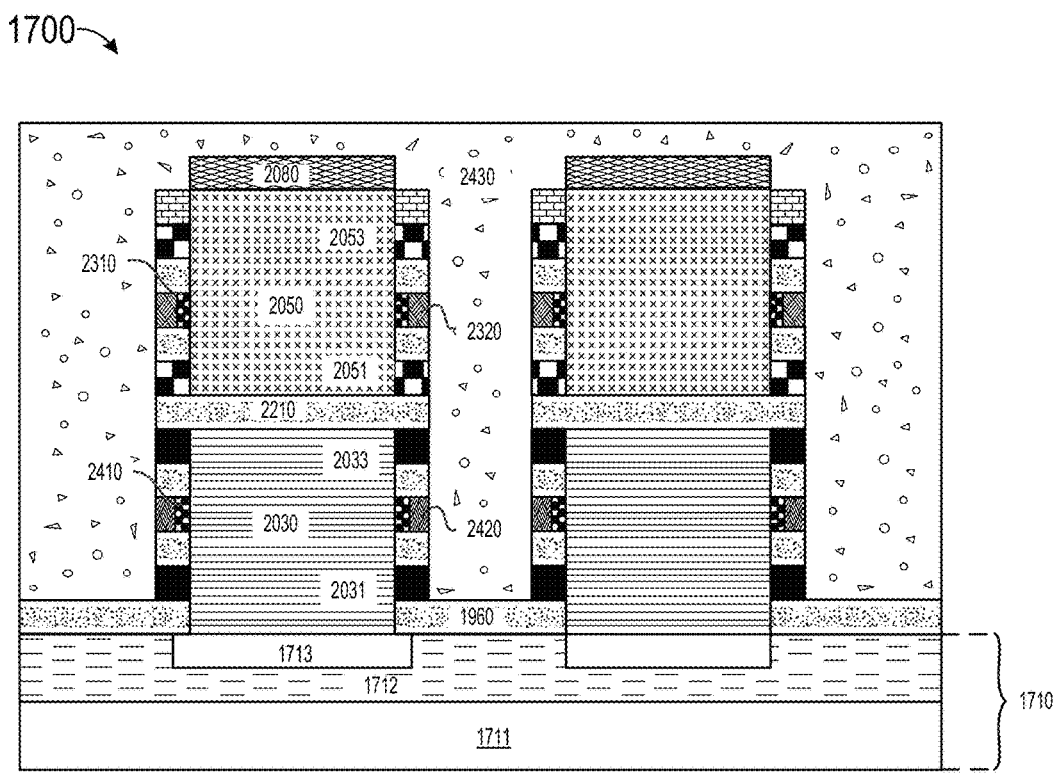
FIG. 24 is a cross-sectional view illustrating complete formation of the GAA PMOS of the exemplary semiconductor device according to some embodiments of the disclosure.

FIG. 24 is a cross-sectional view illustrating complete formation of the GAA PMOS 2030 of the exemplary semiconductor device 1700 according to some embodiments of the disclosure. Similar to the process shown in FIG. 23, the first sacrificial gate layer 1935 can be removed via, for example, by etching, a first gate material 2410 can be formed around the first vertical channel structure 2030, and a first metal material 2420 can be formed around the first gate material 2410. For example, the first gate material 2410 can be a high-k dielectric material. As another example, the first metal material 2420 can be WFM. The first gate material 2410 and the first metal material 2420 can be referred to as a first gate region of the first vertical channel structure 2030. The GAA PMOS 2030 can thus be fabricated and electrically isolated from the GAA NMOS 2050 by the isolation structure 2210. An insulating material 2430, e.g., a dielectric material, can be deposited to fill spaces between the separate stacks and planarized in preparation for circuit hookup.

Figure 24A:
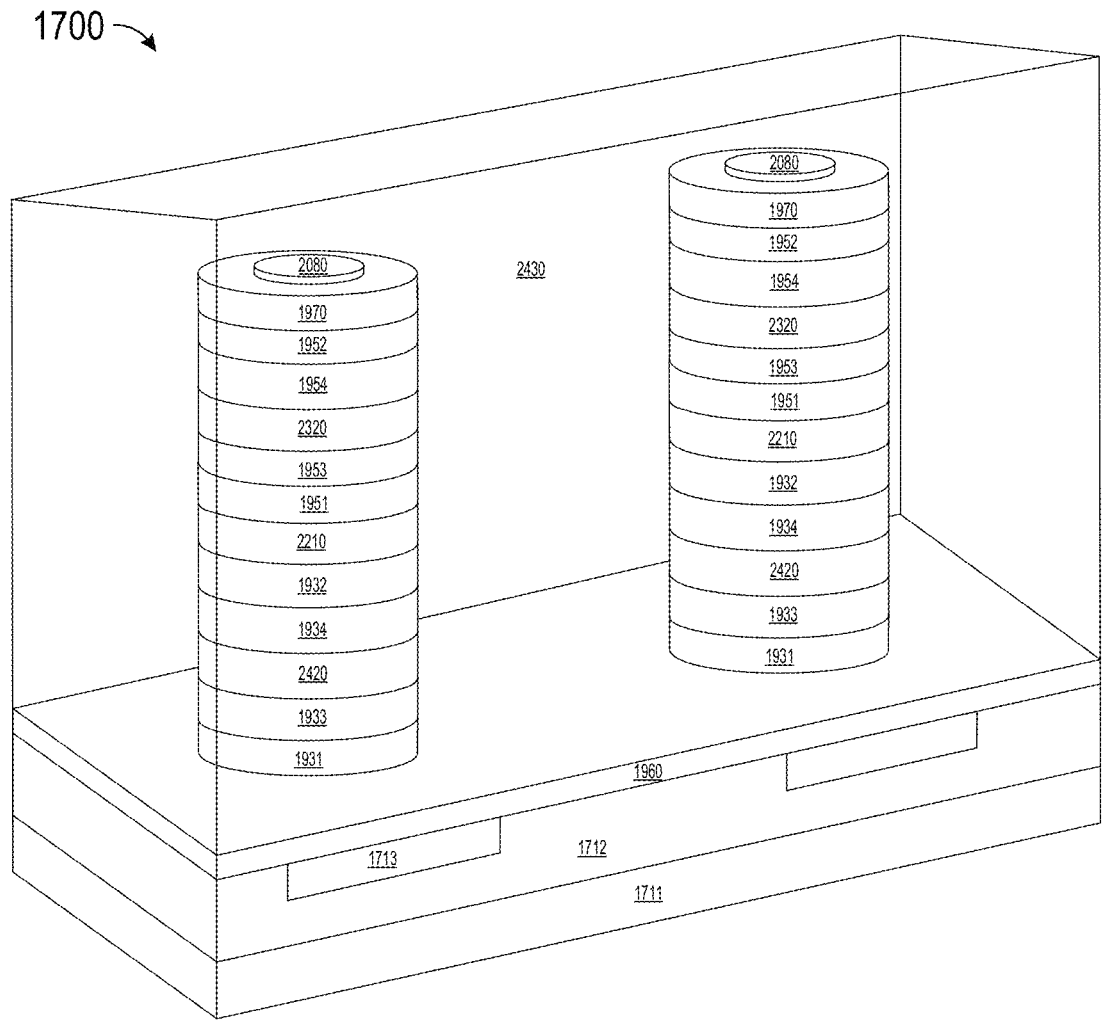
FIG. 24A shows a schematic diagram of the 3D exemplary semiconductor device of FIG. 24.

FIG. 24A shows a schematic diagram of the 3D exemplary semiconductor device 1700 of FIG. 24. While the exemplary semiconductor device 1700 is shown to have two sets of two vertical channel structures that are stacked on each other, i.e., the first vertical channel structure 2030 and the second vertical channel structure 2050, it is understood that the exemplary semiconductor device 1700 can typically include more than two sets of vertical channel structures.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, the method comprising:
    forming a multilayer stack on a substrate, the multilayer stack including alternate metal layers and dielectric layers;
    forming a first opening and a second opening through the multilayer stack to uncover a semiconductor layer of the substrate;
    forming a first vertical channel structure within the first opening, the first vertical channel structure having a first source region and a first drain region being in direct contact with vertical sidewalls of a first metal layer and a third metal layer of the metal layers of the multilayer stack uncovered by the first opening, respectively, and a first gate region being in contact with a vertical sidewall of a second metal layer of the metal layers of the multilayer stack uncovered by the first opening; and
    forming a second vertical channel structure within the second opening, the second vertical channel structure having a second source region and a second drain region being in direct contact with another vertical sidewalls of the first and third metal layers of the multilayer stack uncovered by the second opening, respectively, and a second gate region being in contact with another vertical sidewall of the second metal layer of the metal layers of the multilayer stack uncovered by the second opening.

2. The method of claim 1, wherein forming a first vertical channel structure includes:
    forming a first type channel material on the semiconductor layer of the substrate within the first opening until covering the vertical sidewall of the first metal layer of the metal layers of the multilayer stack to form the first source region of the first vertical channel structure;
    forming a first gate material on the first source region until covering the vertical sidewall of the second metal layer of the metal layers of the multilayer stack above the first metal layer to form the first gate material of the first vertical channel structure; and
    forming the first type channel material on the first source region and the first gate region until covering the vertical sidewall of the third metal layer of the metal layers of the multilayer stack above the second metal layer to form the first drain region of the first vertical channel structure.

3. The method of claim 2, wherein the first gate region and the first drain region are formed by:
    forming the first gate material on the first source region until covering the vertical sidewalls of the second and third metal layers and at least one of the dielectric layers of the multilayer stack therebetween;
    forming the first type channel material on the first source region before reaching the third metal layer;
    removing a portion of the first gate material higher than the first type channel material such that the first gate region covers the vertical sidewall of the second metal layer; and
    forming the first drain region with the first type channel material such that the first drain region covers the vertical sidewall of the third metal layer.

4. The method of claim 2, wherein the first source region covers a vertical sidewall of at least one of the dielectric layers of the multilayer stack between the first metal and the semiconductor layer of the substrate.

5. The method of claim 2, wherein the first source region covers a portion of a vertical sidewall of at least one of the dielectric layers of the multilayer stack between the first metal layer and the second metal layer.

6. The method of claim 1, wherein the substrate includes a first type region and a second type region, the first opening is formed through the multilayer stack to uncover the semiconductor layer of the substrate within the second type region, and the second opening is formed through the multilayer stack to uncover the semiconductor layer of the substrate within the first type region.

7. The method of claim 6, wherein the substrate further includes a diffusion break formed between the first type region and the second region.

* * * * *